United States Patent
Lin

(10) Patent No.: US 8,149,574 B2
(45) Date of Patent: Apr. 3, 2012

(54) COOLING FAN HOUSING ASSEMBLY

(75) Inventor: Sheng-Huang Lin, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 204 days.

(21) Appl. No.: 12/320,000

(22) Filed: Jan. 14, 2009

(65) Prior Publication Data

US 2010/0132918 A1    Jun. 3, 2010

(30) Foreign Application Priority Data

Dec. 1, 2008   (TW) .............................. 97221506 U

(51) Int. Cl.
*H05K 5/00* (2006.01)
*H05K 7/00* (2006.01)
*H05K 7/20* (2006.01)
*H01L 23/34* (2006.01)

(52) U.S. Cl. ......... 361/679.46; 361/679.47; 361/679.48; 361/679.49; 361/679.54; 361/679.58; 174/16.3; 257/717; 257/718

(58) Field of Classification Search .................. 361/690, 361/695, 697, 702–706, 709, 712, 714, 717, 361/718, 719, 722, 79.46, 679.47, 679.48, 361/679.5; 257/712, 713, 717, 718, 719, 257/722; 174/16.3

See application file for complete search history.

(56) References Cited

U.S. PATENT DOCUMENTS

| 6,053,242 | A | * | 4/2000 | Hsieh .............................. 165/121 |
| 6,206,087 | B1 | * | 3/2001 | Nakase et al. ................ 165/80.3 |
| 7,323,776 | B2 | | 1/2008 | Lin |
| 2007/0107880 | A1 | * | 5/2007 | Hong et al. ............... 165/104.33 |
| 2008/0101018 | A1 | * | 5/2008 | Long et al. ..................... 361/695 |

* cited by examiner

Primary Examiner — Jayprakash N Gandhi
Assistant Examiner — Jerry Wu

(57) ABSTRACT

A cooling fan housing assembly for assembling to a heat sink includes a boosting portion and a connecting portion extended from the boosting portion. The connecting portion includes a first part and a second part for covering on and fixing to the heat sink. The second part of the connecting portion is provided with at least one hooking section for firmly hooking to the heat sink, so that a cooling fan supported on the cooling fan housing assembly can be quickly assembled to the heat sink without the risk of producing vibration during the operation of the cooling fan. Therefore, the cooling fan housing assembly not only reduces assembling labor and time and manufacturing cost, but also enables stable operation of the cooling fan.

15 Claims, 7 Drawing Sheets

COOLING FAN HOUSING ASSEMBLY

FIELD OF THE INVENTION

The present invention relates to a cooling fan housing assembly and a thermal module consisting of such cooling fan housing assembly, and more particularly to a cooling fan housing assembly that can be quickly and stably assembled to a heat sink to provide a thermal module.

BACKGROUND OF THE INVENTION

When an electronic device operates, the internal electronic components thereof would produce heat. Therefore, a heat-dissipating unit is required to help in increasing the heat-dissipation efficiency of the electronic device to avoid burnout or other damages of the electronic components due to overheating. The heat-dissipating unit is mainly a radiating fin assembly or a heat sink. Since the above-described heat-dissipating unit alone can only achieve limited effect in dissipating the heat produced by the electronic components, at least one cooling fan is associated with the heat-dissipating unit, so that the cooling fan produces and forces airflows through the heat-dissipating unit to achieve upgraded overall heat dissipation efficiency thereof. Conventionally, the cooling fan is associated with the heat-dissipating unit by directly fixing the cooling fan to the radiating fins of the heat-dissipating unit using fastening elements. By doing this, the radiating fins of the heat-dissipating unit are subject to deformation or even damage. The deformed or damaged radiating fins would result in narrowed flow passages and accordingly wind resistance to adversely affect the heat dissipation. Alternatively, the cooling fan is fixed to the heat-dissipating unit via a separate mounting rack in an attempt to solve the problem of deformed radiating fins and narrowed flow passages. To do so, additional screws or other types of fastening elements are needed to stably and firmly fix the cooling fan and the mounting rack to the heat-dissipating unit.

Please refer to FIG. 1 that is an exploded perspective view of a conventional thermal module 1. As shown, the thermal module 1 includes a cooling fan 11, a mounting rack 12, and a heat sink 13. The cooling fan 11 is provided at four corners with a through hole 111 each. A plurality of screws 14 is threaded through the through holes 111 to lock the cooling fan 11 to the mounting rack 12. The mounting rack 12 is provided at two opposite lower lateral sides with a retaining arm 121 each. The retaining arms 121 can be engaged with notches 131 formed on two lateral sides of the heat sink 13, so as to fixedly hold the cooling fan 11 to the heat sink 13. While the thermal module 1 has the cooling fan 11 connected to the heat sink 13 via the mounting rack 12, a lot of labor and time is needed to do such assembly and thereby increases the manufacturing cost of the thermal module 1. Moreover, the cooling fan 11 vibrates when it operates, bringing the whole thermal module 1 to produce noise or vibration. In brief, the conventional thermal module with a cooling fan has the following disadvantages: (1) having complicated structure; (2) requiring a lot of time and labor to assemble; (3) having increased manufacturing cost; and (4) easy to produce vibration.

It is therefore tried by the inventor to develop an improved cooling fan housing assembly and a thermal module with such cooling fan housing assembly to overcome the drawbacks existed in the prior art cooling fan housing assemblies and thermal modules.

SUMMARY OF THE INVENTION

A primary object of the present invention is to provide a cooling fan housing assembly that enables a cooling fan to be quickly assembled to a heat sink.

Another object of the present invention is to provide a thermal module that includes a cooling fan housing assembly that enables a cooling fan and a heat sink to be quickly assembled together.

To achieve the above and other objects, the cooling fan housing assembly according to the present invention for assembling to a heat sink includes a boosting portion and a connecting portion extended from the boosting portion. The connecting portion includes a first part and a second part for covering on and fixing to the heat sink. The second part of the connecting portion is provided with at least one hooking section for firmly hooking to the heat sink.

And, to achieve the above and other objects, the thermal module according to the present invention includes a heat sink and a cooling fan housing assembly. The heat sink includes a plurality of radiating fins, which define at least one top contact face and a plurality of side faces. The side faces are provided with at least one retaining notch. The cooling fan housing assembly includes a boosting portion and a connecting portion extended from the boosting portion. The connecting portion includes a first part and a second part for covering on and fixing to the heat sink. The second part of the connecting portion is provided with at least one hooking section for firmly hooking to the at least one retaining notch on the heat sink. With the above arrangements, the cooling fan housing assembly enables a cooling fan to be quickly and stably assembled to the heat sink without the risk of producing vibration during the operation of the cooling fan. Therefore, the thermal module of the present invention can be manufactured at reduced labor and time, and enables stable operation of the cooling fan.

In brief, the present invention provides the following advantages: (1) having simple structure; (2) having reduced manufacturing cost; (3) requiring only reduced assembling labor and time; and (4) ensuring a cooling fan to operate stably without producing vibration.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
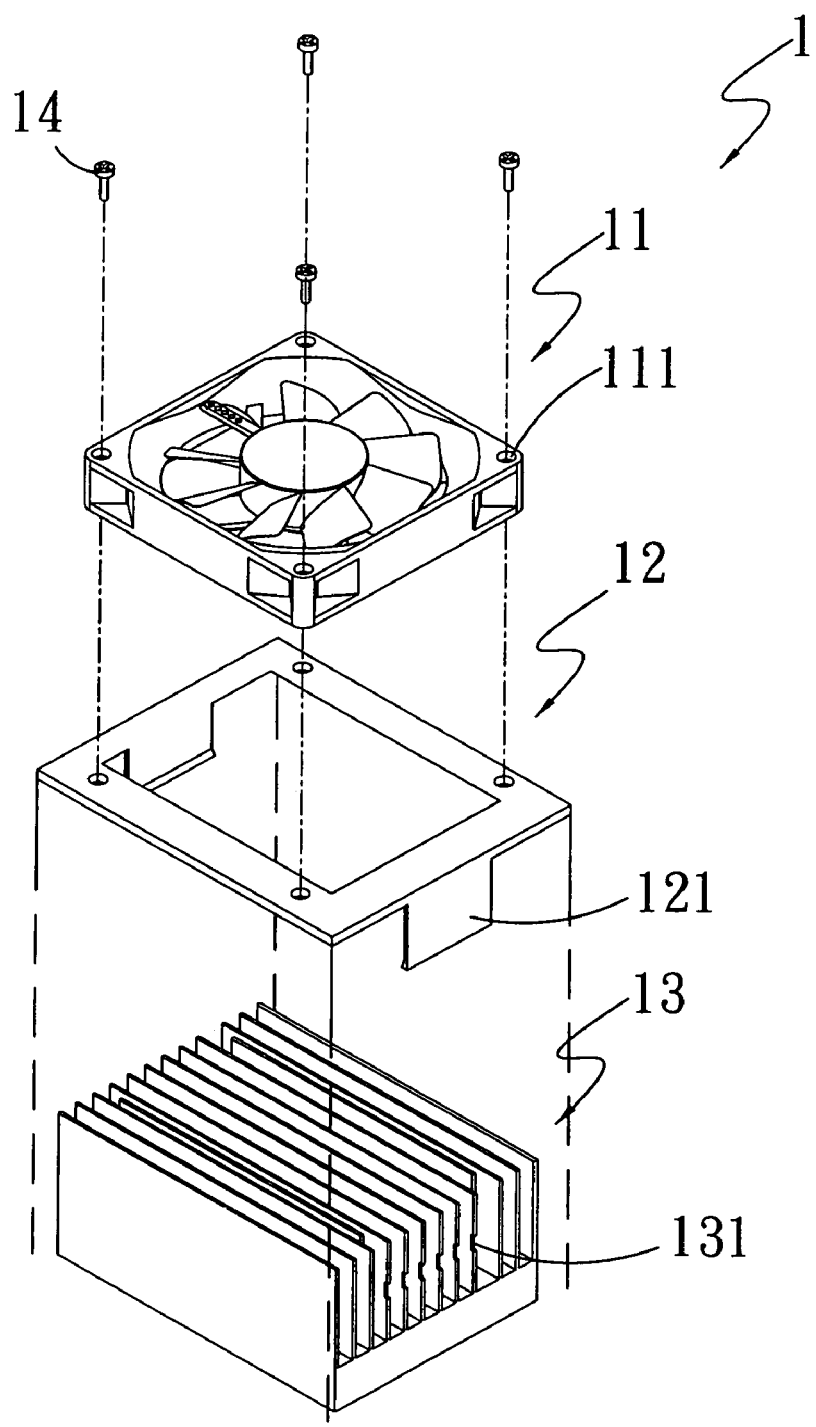
FIG. 1 is an exploded perspective view of a conventional thermal module.
Figure 2:
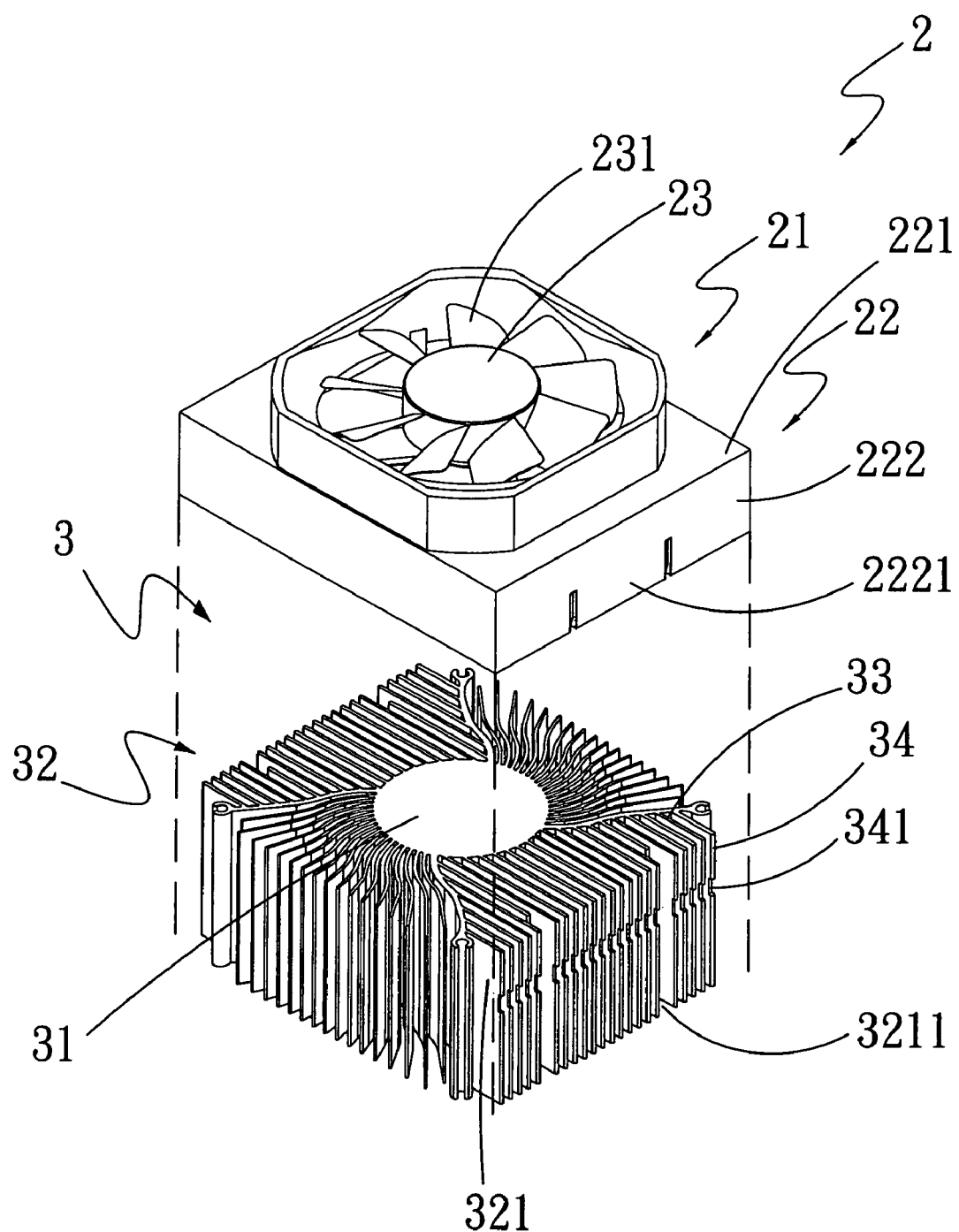
FIG. 2 is an exploded perspective view of a thermal module with a cooling fan housing assembly according to a preferred embodiment of the present invention.
Figure 3:
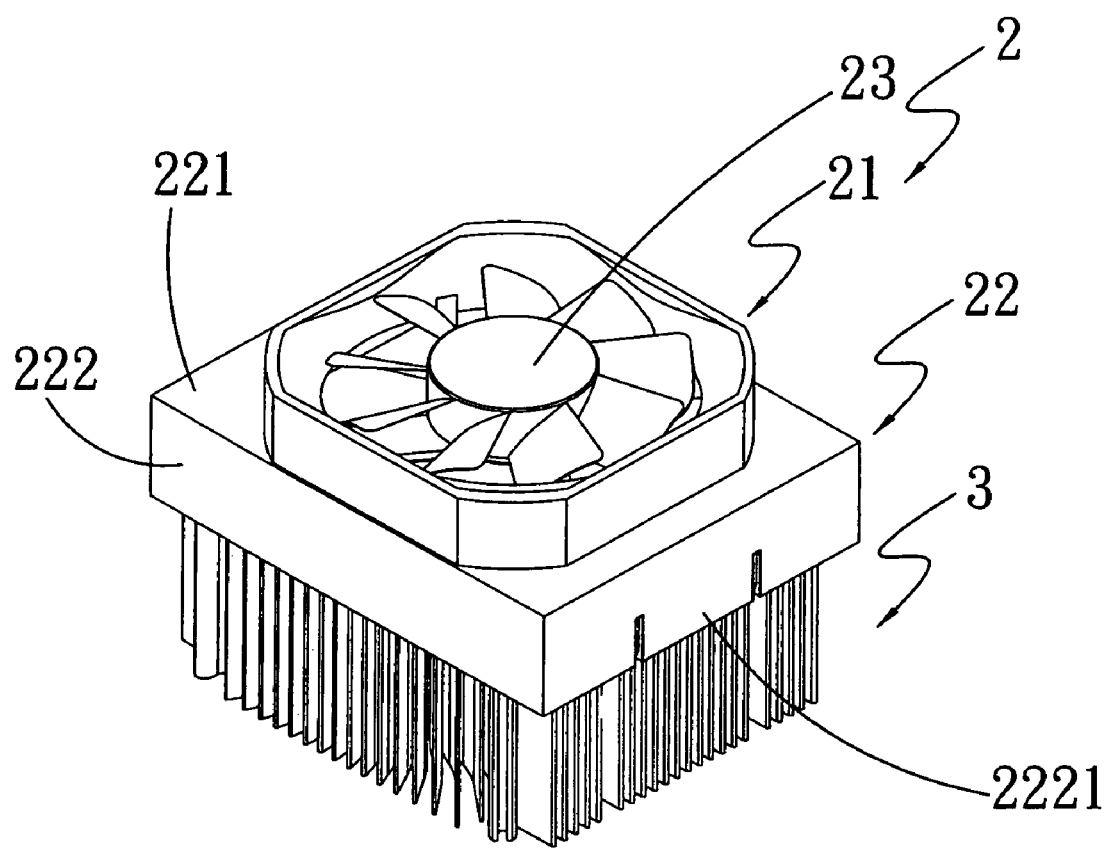
FIG. 3 is an assembled view of FIG. 2.
Figure 4:
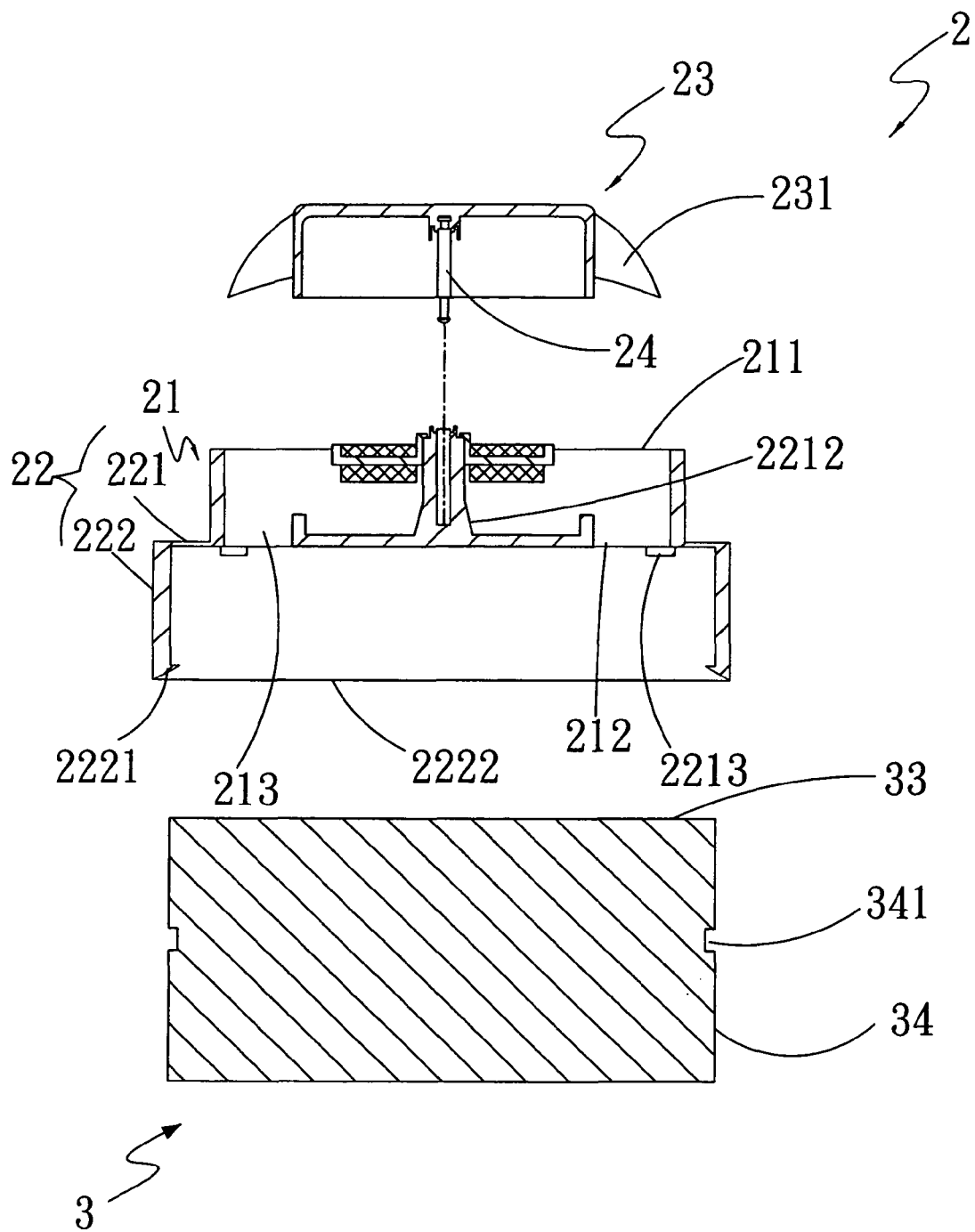
FIG. 4 is a sectioned side view of FIG. 2.
Figure 5:
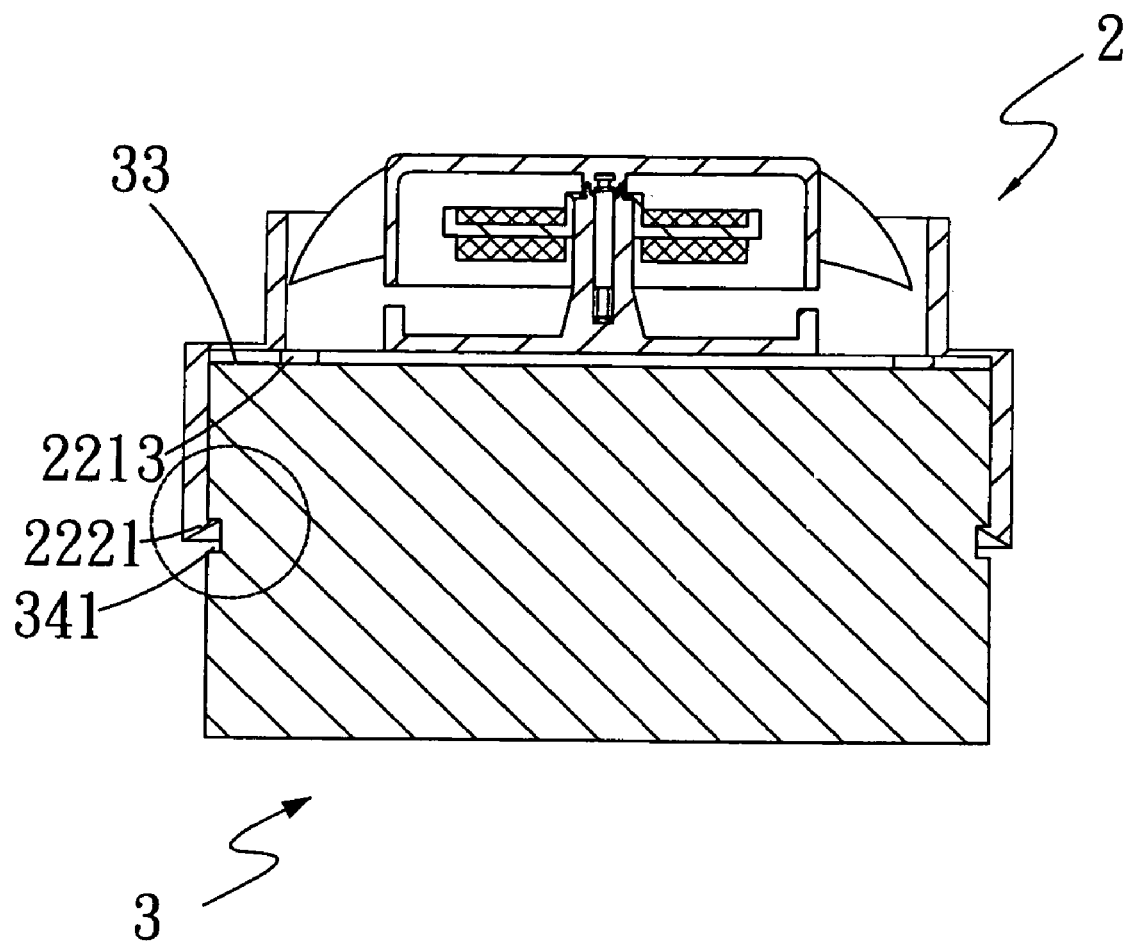
FIG. 5 is an assembled view of FIG. 4.
Figure 5A:
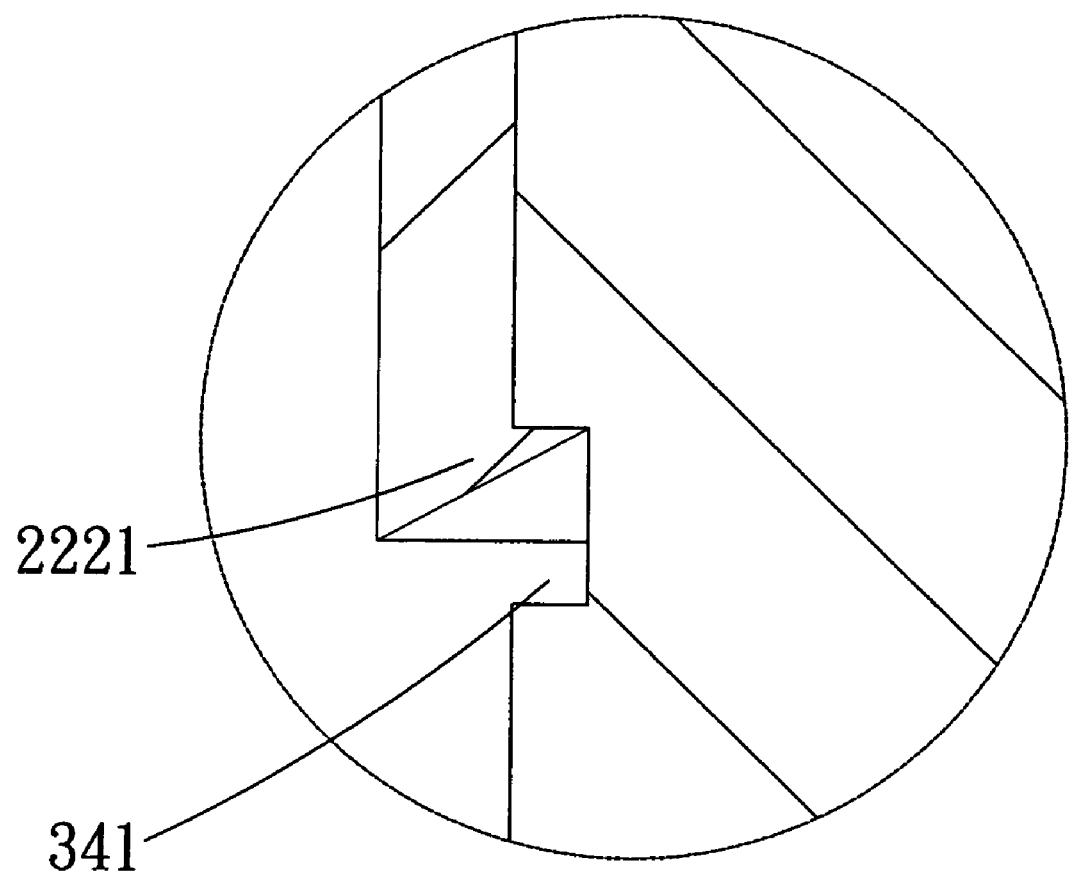
FIG. 5A is an enlarged view of the circled area in FIG. 5.
Figure 6:
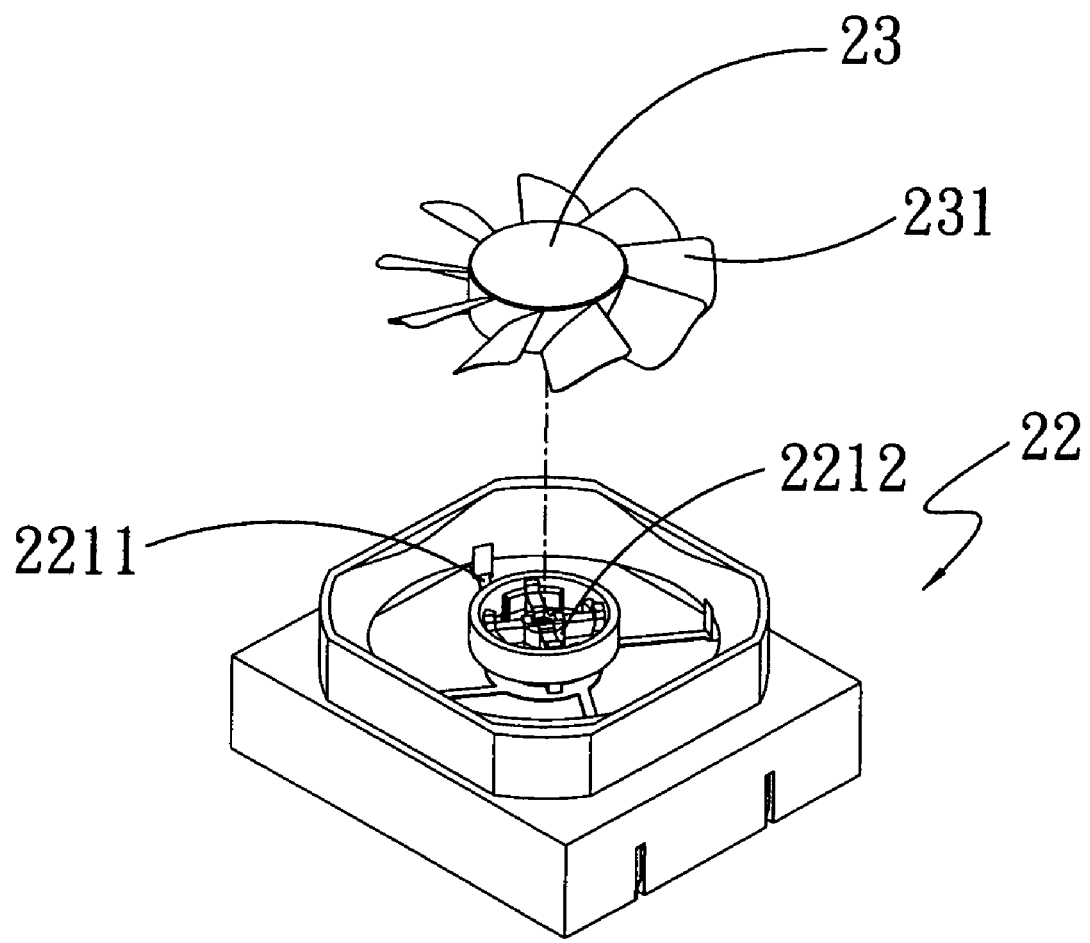
FIG. 6 is a partially exploded perspective view of a cooling fan housing assembly according to a preferred embodiment of the present invention.

Please refer to FIGS. 2, 3, 4, 5, 5A, and 6. A cooling fan housing assembly 2 according to a preferred embodiment of the present invention includes a boosting portion 21 and a connecting portion 22 extended from an end of the boosting portion 21. The connecting portion 22 includes a first part 221 and a second part 222. The first and the second part 221, 222 can be covered on and fitted around a heat sink 3. The second part 222 of the connecting portion 22 is provided with at least one hooking section 2221 for hooking to the heat sink 3. The boosting portion 21 defines a first open end 211, a second open end 212, and a flow passage 213 communicating the first open end 211 with the second open end 212.

The first part 221 of the connecting portion 22 has an end that is integrally extended from the boosting portion 21, and another opposite end that is integrally extended to form the second part 222. As can be seen from FIGS. 4, 5, and 6, the first part 221 of the connecting portion 22 is also provided with a plurality of connecting bars 2211, a substantially cylindrical spindle seat 2212, and at least one radially inward projected stopper 2213. The connecting bars 2211 are connected at respective radially inner ends to the cylindrical spindle seat 2212 and at respective radially outer ends to an inner wall surface of the cooling fan housing assembly 2. A fan blade assembly 23 is rotatably supported on the cylindrical spindle seat 2212, and includes a plurality of blades 231 and a spindle 24. The fan blade assembly 23 is located in the boosting portion 21 with the spindle 24 inserted in the cylindrical spindle seat 2212. The second part 222 of the connecting portion 22 defines a third open end 2222, which is communicable with the first and the second open end 211, 212 via the flow passage 213.

The present invention also provides a thermal module consisting of a cooling fan with the above-described cooling fan housing assembly 2 and a heat sink 3. Please refer to FIGS. 2, 4, 5, 5A, and 6. The heat sink 3 includes a heat-absorbing portion 31 and a heat-dissipating portion 32. The heat-dissipating portion 32 is outward extended from a periphery of the heat-absorbing portion 31, and includes a plurality of radiating fins 321. The radiating fins 321 together define at least one heat-dissipating flow passage 3211 among them, at least one top contact face 33 at a top thereof, and a plurality of side faces 34 along outer edges thereof. At least one retaining notch 341 is formed on the side faces 34. The cooling fan housing assembly 2, as having been described above, includes a boosting portion 21 and a connecting portion 22 extended from an end of the boosting portion 21. The connecting portion 22 includes a first part 221 and a second part 222 for covering on and fitting around the heat sink 3. The second part 222 of the connecting portion 22 is provided with at least one hooking section 2221 for hooking to the at least one retaining notch 341 on the heat sink 3.

The boosting portion 21 defines a first open end 211, a second open end 212, and a flow passage 213 communicating the first open end 211 with the second open end 212. The first part 221 of the connecting portion 22 has an end that is integrally extended from the boosting portion 21, and another opposite end that is integrally extended to form the second part 222. As can be seen from FIGS. 4, 5, and 6, the first part 221 of the connecting portion 22 is also provided with a plurality of connecting bars 2211, a substantially cylindrical spindle seat 2212, and at least one radially inward projected stopper 2213. The connecting bars 2211 are connected at respective radially inner ends to the cylindrical spindle seat 2212 and at respective radially outer ends to an inner wall surface of the cooling fan housing assembly 2. The second part 222 of the connecting portion 22 defines a third open end 2222, which is communicable with the first and the second open end 211, 212 via the flow passage 213.

The first part 221 of the connecting portion 22 of the cooling fan housing assembly 2 faces toward the top contact face 33 of the heat sink 3, and the second part 222 of the connecting portion 22 of the cooling fan housing assembly 2 faces toward and surrounds the side faces 34 of the heat sink 3. When the cooling fan housing assembly 2 is assembled to the heat sink 3, the cooling fan housing assembly 2 is located at and covered on one end of the heat sink 3, so that the top contact face 33 of the heat sink 3 is pressed against the at least one stopper 2213 provided at the first part 221 of the connecting portion 22 of the cooling fan housing assembly 2. Meanwhile, the at least one hooking section 2221 provided on the second part 222 of the connecting portion 22 of the cooling fan housing assembly 2 is engaged with and retained to the at least one retaining notch 341 provided on the side faces 34 of the heat sink 3, so that the cooling fan assembly 2 can be quickly and stably assembled to the heat sink 3, and a cooling fan supported on the cylindrical spindle seat 2212 can operate without producing vibration. Therefore, the thermal module formed from the cooling fan housing assembly 2 and the heat sink 3 can have an extended service life.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A one-piece cooling fan housing assembly for connecting to a heat sink, comprising:
  a boosting portion; and
  a connecting portion extended from the boosting portion and including a first part and a second part; the first and the second part being covered on and having sides surrounding the heat sink, wherein the heat sink has a generally open bottom that directs cooling and contacting radiating fins through the bottom and is provided with a plurality of retaining notches on the side faces of said radiating fins, and the second part being provided with at least one integral hooking section for quickly and firmly hooking to the plurality of retaining notches of the heat sink in a removable snap fit relation;
  wherein the first part includes at least one integral radially inward projected stopper configured such that when the fan housing assembly is attached to the heat sink, the at least one stopper provides a space between the fan and the heat sink such that in combination with the notches the heat sink is tightly captured between the hooked notches and the at least one inward projected stopper and the tight fit and spacing provided by such combination thereby reduces vibration in the system.

2. The cooling fan housing assembly as claimed in claim 1, wherein the first part of the connecting portion includes a plurality of connecting bars, a cylindrical spindle seat, each of the connecting bars being connected at a radially inner end to the cylindrical spindle seat and at a radially outer end to an inner wall surface of the cooling fan housing assembly.

3. The cooling fan housing assembly as claimed in claim 2, wherein the cylindrical spindle seat supports a fan blade assembly thereon, and the fan blade assembly includes a plurality of blades and a spindle.

4. The cooling fan housing assembly as claimed in claim 1, wherein the boosting portion defines a first open end, a second open end, and a flow passage communicating the first open end with the second open end.

5. The cooling fan housing assembly as claimed in claim 1, wherein the first part of the connecting portion has an end integrally extended from the boosting portion, and another opposite end integrally extended to form the second part of the connecting portion.

6. The cooling fan housing assembly as claimed in claim 1, wherein the second part of the connecting portion defines a third open end.

7. A thermal module, comprising:
- a heat sink having a generally open bottom including a plurality of spaced radiating fins, the radiating fins together defining at least one top contact face and a plurality of side faces, and the side faces having at least one retaining notch provided thereon; and
- a one-piece cooling fan housing assembly including a boosting portion and a connecting portion extended from the boosting portion; the connecting portion including a first part and a second part, the first and the second part being covered on and having sides extending around the heat sink, and the second part being provided with at least one integral hooking section for firmly hooking to the at least one retaining notch on the side faces of said radiating fins of the heat sink;
- wherein the first part includes at least one integral radially inward projected stopper configured such that when the fan housing assembly is attached to the heat sink, the at least one stopper provides a space between the fan and the heat sink such that in combination with the notches the heat sink is tightly captured between the hooked notches and the at least one inward projected stopper and the tight fit and spacing provided by such combination thereby reduces vibration in the system.

8. The thermal module as claimed in claim 7, wherein the heat sink includes a heat-absorbing portion and a heat-dissipating portion; and the heat-dissipating portion being outward extended from a periphery of the heat-absorbing portion.

9. The thermal module as claimed in claim 7, wherein the first part of the connecting portion of the cooling fan housing assembly includes a plurality of connecting bars, a cylindrical spindle seat, each of the connecting bars being connected at a radially inner end to the cylindrical spindle seat and at a radially outer end to an inner wall surface of the cooling fan housing assembly.

10. The thermal module as claimed in claim 9, wherein the cylindrical spindle seat supports a fan blade assembly thereon, and the fan blade assembly includes a plurality of blades and a spindle.

11. The thermal module as claimed in claim 7, wherein the first part of the connecting portion has an end integrally extended from the boosting portion, and another opposite end integrally extended to form the second part of the connecting portion.

12. The thermal module as claimed in claim 7, wherein the second part of the connecting portion defines a third open end.

13. The thermal module as claimed in claim 7, wherein the radiating fins together define at least one heat-dissipating flow passage among them.

14. The thermal module as claimed in claim 7, wherein the first part of the connecting portion of the cooling fan housing assembly faces toward the top contact face of the heat sink, and the second part of the connecting portion of the cooling fan housing assembly faces toward and surrounds the side faces of the heat sink.

15. The thermal module as claimed in claim 7, wherein the boosting portion of the cooling fan housing assembly defines a first open end, a second open end, and a flow passage communicating the first open end with the second open end.

* * * * *